US009065477B2

(12) United States Patent
Rajasekhar et al.

(10) Patent No.: US 9,065,477 B2
(45) Date of Patent: Jun. 23, 2015

(54) LINEAR AND DC-ACCURATE FRONTEND DAC AND INPUT STRUCTURE

(71) Applicants: Sanjay Rajasekhar, Bangalore (IN); Abhilasha Kawle, Bangalore (IN); Roberto S Maurino, Turin (IT); Srikanth Nittala, Bangalore (IN)

(72) Inventors: Sanjay Rajasekhar, Bangalore (IN); Abhilasha Kawle, Bangalore (IN); Roberto S Maurino, Turin (IT); Srikanth Nittala, Bangalore (IN)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/179,279

(22) Filed: Feb. 12, 2014

(65) Prior Publication Data

US 2015/0061908 A1   Mar. 5, 2015

Related U.S. Application Data

(60) Provisional application No. 61/872,945, filed on Sep. 3, 2013.

(51) Int. Cl.
*H03M 1/66*   (2006.01)

(52) U.S. Cl.
CPC ..................... *H03M 1/66* (2013.01)

(58) Field of Classification Search
CPC ....... H03M 1/747; H03M 1/00; H03M 1/785; H03K 5/08
USPC ................... 341/144, 150, 154, 136; 327/313
See application file for complete search history.

(56) References Cited

U.S. PATENT DOCUMENTS

| | | | |
|---|---|---|---|
| 4,551,709 A | 11/1985 | Merchant et al. | |
| 5,574,455 A | 11/1996 | Hori et al. | |
| 6,061,010 A | 5/2000 | Adams et al. | |
| 6,555,996 B2 | 4/2003 | Drori et al. | |
| 6,621,438 B1 | 9/2003 | Hong | |
| 6,812,879 B2 | 11/2004 | Suwa et al. | |
| 7,079,063 B1 | 7/2006 | Nguyen et al. | |
| 7,256,721 B2 | 8/2007 | Copley | |
| 7,307,568 B1 | 12/2007 | Nguyen et al. | |
| 7,551,028 B1 | 6/2009 | Cyrusian | |
| 8,456,341 B2 | 6/2013 | Hezar et al. | |
| 8,653,999 B1 * | 2/2014 | Verlinden | 341/144 |

OTHER PUBLICATIONS

Kohno et al., "A 350-MS/s 3.3-V 8-bit CMOS D/A Converter using a Delayed Driving Scheme," Proceedings of the 1995 IEEE Custom Integrated Circuits Conference, pp. 211-214, May 1995.
Schofield et al., "A 16b 400MS/s DAC with <-80dBc IMD to 300MHz and <-160dBm/Hz Noise Power Spectral Density," 2003 IEEE International Solid-State Circuits Conference (ISSCC 2003) Digest of Technical Papers, pp. 126, 482-490.
Adams et al., "A 113-dB SNR oversampling DAC with segmented noise-shaped scrambling," IEEE J. Solid-State Circuits, pp. 1871-1878, Dec. 1998.

* cited by examiner

*Primary Examiner* — Joseph Lauture
(74) *Attorney, Agent, or Firm* — Kenyon & Kenyon LLP

(57) ABSTRACT

A digital-to-analog (DAC) element may include a plurality of switches arranged to form two circuit branches between a current source and a first and a second outputs. The first circuit branch may include two switches defining parallel current paths between the current source and the first output terminal. The second circuit branch may include two switches defining parallel current paths between the current source and the second output terminal. A control circuit, responsive to an input signal that selects one of the circuit branches, may provide control signals to close one of switches in the selected circuit branch in a first portion of a clock cycle and to close the other of the switches in the selected circuit branch in a second portion of the clock cycle.

27 Claims, 7 Drawing Sheets

100

200

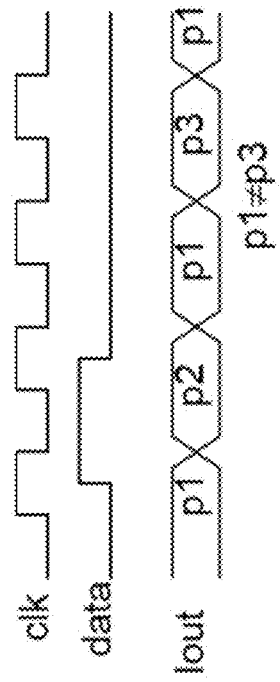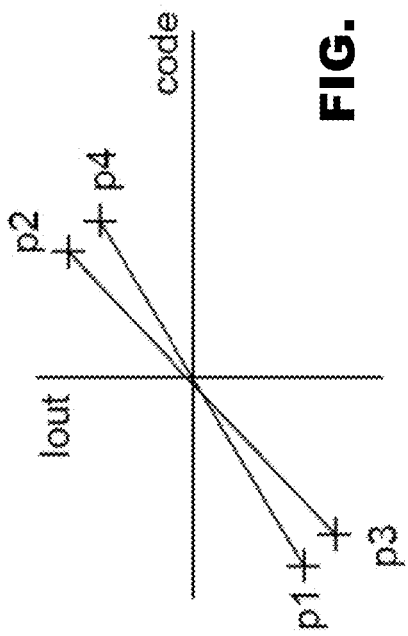
FIG. 3A
FIG. 3B

400

500

600

LINEAR AND DC-ACCURATE FRONTEND DAC AND INPUT STRUCTURE

PRIORITY CLAIM

The present application claims priority to U.S. Provisional Application No. 61/872,945, filed on Sep. 3, 2013, the entirety of which is incorporated by reference herein.

BACKGROUND

The present invention relates to analog-to-digital converters (ADCs), in particular to continuous-time delta-sigma modulators (CTDSMs).

CTDSM technology is gaining popularity due to its power-efficient operation well suited for high-speed, high-performance systems. In a CTDSM, typically an input analog signal, which can vary continually over time, is converted to a coarse high data rate digital stream, which represents the input with high fidelity in the frequency band of interest. This high data rate digital stream then goes through digital post-processing (typically decimation) to provide the final low data rate digital code stream which represents the analog input signal in digital domain with high fidelity.

Conventional CTDSMs use a current DAC in a feedback path of the modulator. Current DACs can suffer from content-dependent errors. Specifically, switch changes may occur in circuit elements of the DAC when the digital code input to them changes, which may generate a virtual ground glitch. However, when the digital code input to the unit cell does not change, such glitches do not appear. These error are content-dependent because they vary based on the digital codes that are input to the current DAC.

Quad-switching is a known technique to mitigate these types of glitches. In a quad-switched DAC, "dummy" switching may be induced in all unit cells of the DAC, regardless of whether the content being input to those unit cells changes or not. Thus, glitch errors are expected to be generally consistent in the current DAC and independent of the content that is input to it.

Although quad-switching helps to mitigate content-dependent errors in current DACs, which typically are considered AC operations, current DACs also suffer problems due to DC errors that are generated by the unit cells. Therefore, the inventors recognized a need in the art for linear CTDSM architectures that have high DC and AC performance.

BRIEF DESCRIPTION OF THE DRAWINGS

So that features of the present invention can be understood, a number of drawings are described below. It is to be noted, however, that the appended drawings illustrate only particular embodiments of the disclosure and are therefore not to be considered limiting of its scope, for the invention may encompass other equally effective embodiments.

FIGS. 3A and 3B illustrate exemplary operations of switches shown in FIG. 2.

DETAILED DESCRIPTION

Embodiments of the present invention provide circuit architectures and control methods that reduce operational errors in current DACs and, in particular, that reduce DC errors. In an embodiment, a DAC unit cell may have two pairs of circuit branches that connect a current source of the cell to a pair of cell outputs. A first pair of circuit paths connects the current source to a first output. A second pair of circuit paths connects the current source to a second output. Each circuit path may include a control switch, that ideally would be identical to the other control switches but may not be identical due to manufacturing errors. The DAC cell may be configured to generate an output current iteratively in each clock cycle. During operation, the DAC cell may output current to a selected output terminal in a first portion of the clock cycle via a first control switch, then may output current to the same selected output terminal in a second portion of the clock cycle via another control switch. In this manner, errors which otherwise might be induced by manufacturing errors of the two switches may be mitigated.

Figure 1:
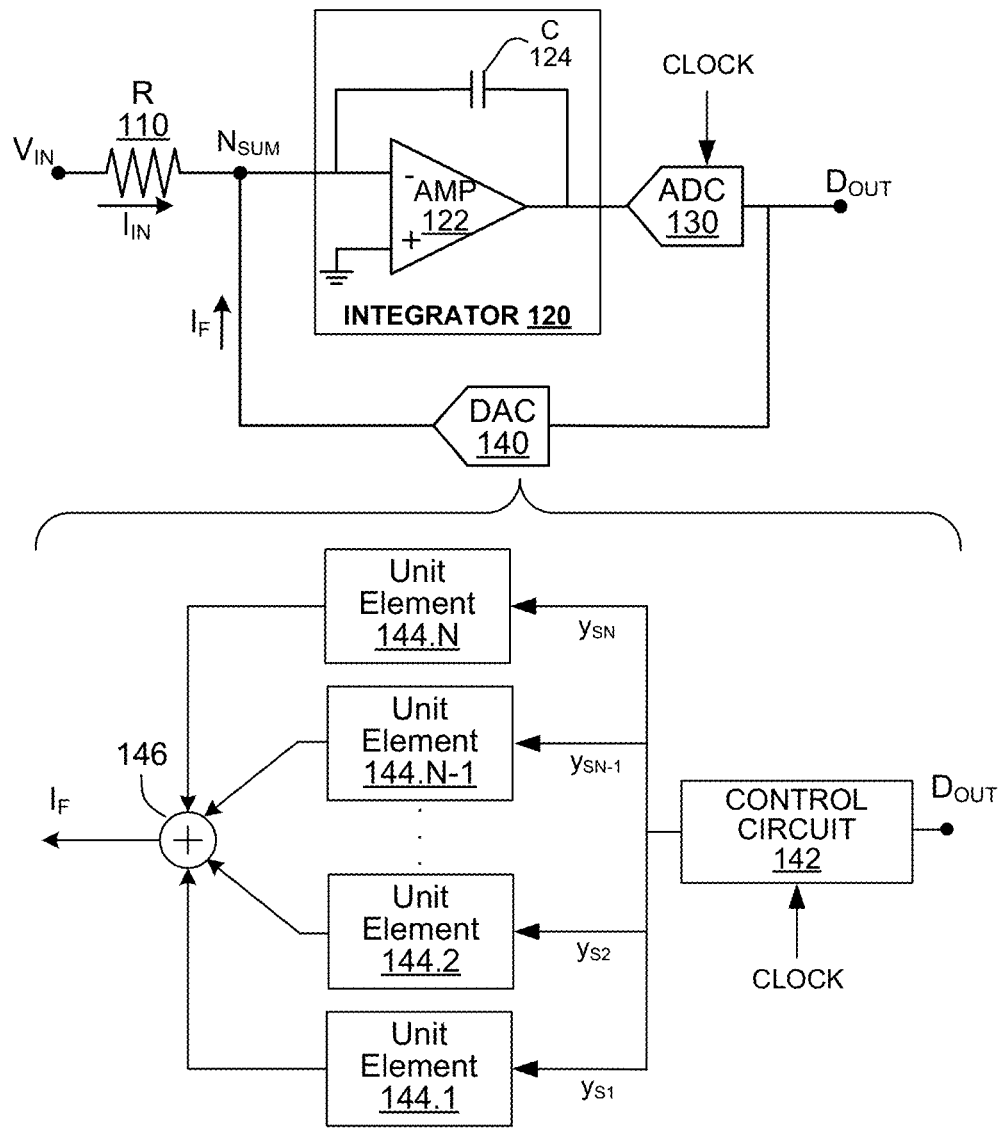
FIG. 1 is a simplified block diagram of a CTDSM according to an embodiment of the present invention.

FIG. 1 is a simplified block diagram of a CTDSM 100 according to an embodiment of the present invention. The CTDSM 100 may include an input resistor 110, an integrator 120, an ADC 130, and a digital-to-analog converter (DAC) 140. The CTDSM 100 may receive an analog input signal $V_{IN}$ at an input and provide a digital output signal $D_{OUT}$ at an output corresponding to the analog input signal $V_{IN}$.

An input signal $V_{IN}$ may be provided to a first terminal of the input resistor 110, and a second terminal of the input resistor 110 may be coupled to an input terminal of the integrator 120. An output of the integrator 120 may be coupled to an input of the ADC 130. The ADC 130 may provide the digital output signal $D_{OUT}$ to an output of the CTDSM 100. The output of the ADC 130 also may be input to a feedback path, which includes a DAC 140, that connects to the integrator 120. The DAC 140 may generate a current $I_F$ which may be input to node $N_{SUM}$ along with a current $I_{IN}$ supplied by the resistor 110.

The input signal $V_{IN}$ may be an analog signal, which may vary over time. The input signal $V_{IN}$ may be applied to the input resistor 110 to provide an input current $I_{IN}$ corresponding to the input voltage signal $V_{IN}$. The integrator 120 may receive the input current $I_{IN}$ and an analog-converted feedback signal $I_F$ from the DAC 140, and integrate a sum of the input current $I_{IN}$ and the feedback signal $I_F$. The integrator 120, may include an operational amplifier 122 and an integrating capacitor 124. The input signal $V_{IN}$ may be a single-ended signal or a differential signal.

The ADC 130 may convert the output of the integrator 120 into a digital code $D_{OUT}$. The DAC 140 may convert the digital code $D_{OUT}$ into an analog feedback signal $I_F$. The analog feedback signal $I_F$ may be summed with the input current $I_{IN}$ at the summing node $N_{SUM}$, and the summed signal may be provided to the integrator 120.

The DAC 140 may be implemented as a resistor DAC, a current steering DAC or another DAC architecture. The resistor DAC may include resistor elements and switch elements. In an embodiment, the resistor elements may be thin-film resistors (TFRs).

The DAC 140 may include a control circuit 142, a number of current elements 144.1-144.N and an adder 146. The control circuit 142 may provide control signals $y_{S1}$-$y_{SN}$ to the current elements 144.1-144.N, respectively, based on the input digital code $D_{OUT}$. The control signals $y_{S1}$-$y_{SN}$ may turn on and off a plurality of switches within each current element to control the contribution of each current element to the output signal $I_F$ representing the digital code $D_{OUT}$. The outputs of the current elements 144.1-144.N may be summed via adder 146 to provide the output signal $I_F$. The DAC 140 may receive a new digital code $D_{OUT}$ and generate an output signal $I_F$ every cycle of the clock. As will be discussed in more detail below, the control circuit 142 may provide control signals $y_{S1}$-$y_{SN}$ such that during one clock cycle different switches are activated in the current elements while maintaining the elements' state at a common nominal level.

The current elements 144.1-N may be identical unit elements (e.g., two-level current steering elements or three-level current steering elements). The two-level current steering elements may provide an output that varies between two states: a positive state and an inert state or, alternatively, a positive state and a negative state. The three-level current steering unit elements may provide three output states: a positive state, a negative state and an inert state. In such an embodiment, the positive states and negative states of each of the unit elements 144.1-N would generate currents having identical magnitudes (absent manufacturing variations). In this example, the DAC 140 may include $2^N$ unit elements for an N-bit code $D_{OUT}$.

Alternatively, the current elements 144.1-N may be weighted cells, where each of the weighted cells 144.1-N may provide a different current value. In such an embodiment, the positive states and negative states of the binary-weighted unit elements 144.1-N would generate currents having magnitudes that are related by $2^i$ (again, absent manufacturing variations), where i=0, 1, 2, . . . N. In this example, the DAC 140 may include N current elements for an N-bit code $D_{OUT}$.

In another embodiment, the DAC may be provisioned as a hybrid system that includes both unit elements and weighted cells. In a hybrid system, the most significant bits may be provided to the unit elements and the least significant bits may be provided to the weighted cells. In this example, the DAC 140 may have some number of current elements between N and $2^N$ for an N-bit code $D_{OUT}$.

Figure 2:
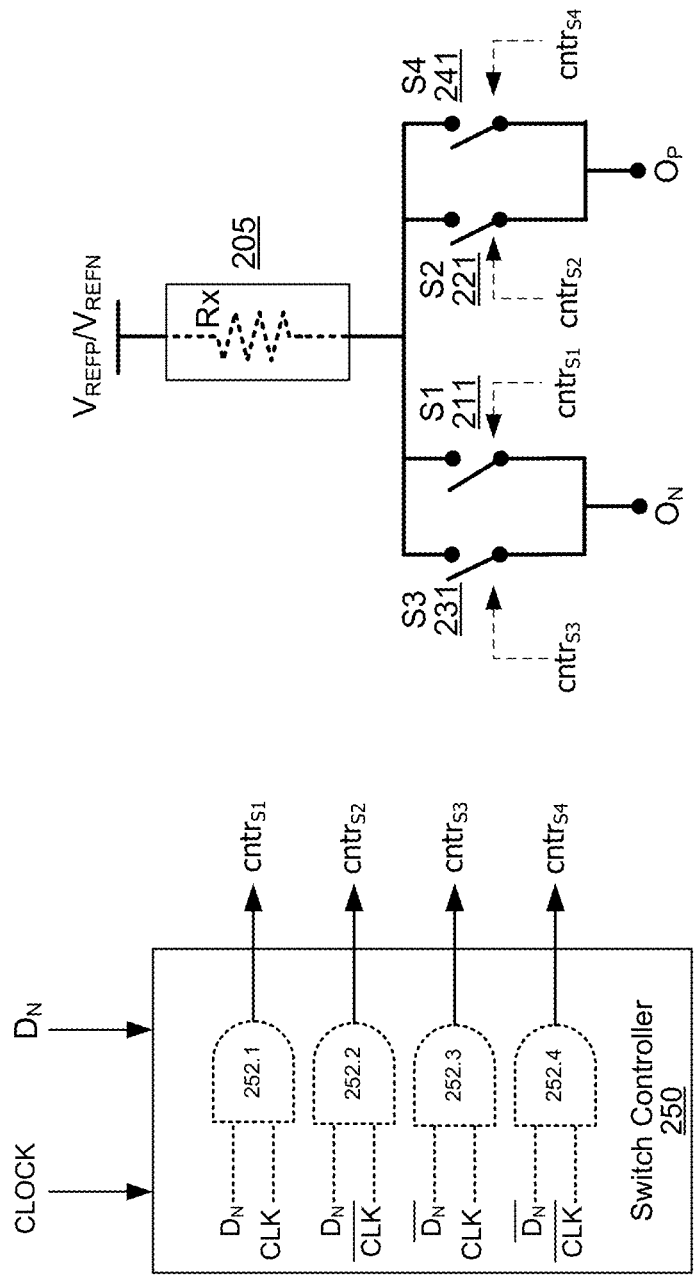
FIG. 2 illustrates a simplified circuit diagram of a DAC element according to an embodiment of the present invention.

FIG. 2 illustrates a simplified circuit diagram of a current element 200 according to an embodiment of the present invention. The current element 200 may include a current source 205 and a plurality of switches S1-S4 (211, 221, 231, and 241) coupling the current source 205 to outputs $O_N$, $O_P$. The DAC element 200 also may include a switch controller 250 providing control signals $cntr_1$-$cntr_4$ to the switches S1-S4, respectively. The DAC element 200 may be provided in the DAC 140 of FIG. 1.

The switches S1-S4 (211, 221, 231, and 241) may establish two circuit branches between the current source 205 and each of the outputs $O_N$, $O_P$. Switches 211 and 231 may define a first branch that extends between the current source 205 and the first output $O_N$. Switches 221 and 241 may define a second branch that extends between the current source 205 and the second output $O_P$.

Control signals $cntr_1$-$cntr_4$ may open and close the switches S1-S4 (211, 221, 231 and 241) to provide current paths between the current source 205 and the outputs $O_N$, $O_P$. For example, when switch 211 is closed a path may be provided for the current to travel between the current source 205 and virtual ground $O_N$. When switch 231 is closed, a path may be provided for the current to travel between the current source 205 and virtual ground $O_N$. When switch 221 is closed, a path may be provided for the current to travel between the current source 205 and virtual ground $O_P$. When switch 241 is closed a path may be provided for the current to travel between the current source 205 and virtual ground $O_P$.

The current source 205 may be coupled at one end to a reference voltage $V_{REF}$. The other end of the current source 205 may be coupled to the switches S1-S4 (211, 221, 231, and 241). In many embodiments, the current source 205 may be provided as a resistor Rx which may be a thin film resistor and which gives low 1/f noise corners. However, the principles of the present invention may find application with active current sources if desired for other application needs.

The switches S1-S4 may be controlled to provide one of two states of operations during each cycle of the clock, by coupling the current source 205 to one of the outputs $O_N$, $O_P$. The switch controller 250 may provide control signals $cntr_{S1}$-$cntr_{S4}$ to the switches S1-S4 based on the digital input signal $D_N$ that controls the current element 200 and an input clock signal. In a first state of the input signal $D_N$, the DAC element 200 may provide current to the output $O_N$ by activating the switches S1 and/or S3. In a second state of the input signal $D_N$, the DAC element 200 may provide current to the output $O_P$ by activating the switches S2 and/or S4. The state of the input signal DN may (but need not) change in each clock cycle based on changes in the $D_{OUT}$ code (FIG. 1).

The switch controller 250 may include a variety of logic gates 252.1-252.4 to control operation of the switches S1-S4. The logic gates 252.1-252.4 may be provided as AND gates as illustrated in FIG. 2 or other logical operations may be performed.

During operation, a new value of the input signal $D_N$ may be input to the current element 200 during each clock cycle CLK. In a first phase of the CLK cycle, the input signal $D_N$ will cause a switch (say, S1 or S2) in one of the branches to close. In a second phase of the CLK cycle, the CLK may change state but the input signal DN may maintain its state. In that case, another switch in the same branch will close. If switch S1 had closed in the first phase of the CLK then switch S3 may close in the second phase of the CLK. Similarly, if S2 had closed in the first phase of the CLK, then switch S4 may close in the second phase of the CLK. Thereafter, operation may proceed to another cycle of the CLK signal in which the input signal $D_N$ may but need not change state.

The operation of the current element 200 described above helps reduce DC errors while at the same time providing the AC benefits of quad-switching. Even when an input signal DN maintains its state over a prolonged period of time (say, the DN=1 for two or more CLK cycles), the current element 200 will exhibit switch activity by switching between two switches in a common circuit branch (e.g., S1 and S3 in FIG. 2). Thus, any errors introduced by switch activity should remain content independent. Moreover, switching between the two paths of a common circuit branch on each clock phase helps to protect against DC errors.

In other embodiments (now shown in FIG. 2), additional switches may be provided in parallel to the switches S1 and S3 and/or the switches S2 and S4 which may provide for three or more parallel current paths in each branch. With these embodiments, each of the switches provided in parallel may be activated for a portion of the clock cycle to provide the same state. Each switch may be activated for approximately the same portion of the cycle.

In one embodiment, a third state (i.e., an inert state) may be provided during which the current is not provided to the outputs $O_N$, $O_P$. This state may be provided by tri-level unit elements. In this embodiment, one or more additional switches may be provided between the current source 205 and a dump node. The third state may be provided when these switches are activated to couple the current source 205 to the dump node.

The switches S1-S4 (211, 221, 231 and 241) may be implemented as MOS transistors (e.g., NMOS, PMOS or low voltage NMOS). The switches S1-S4 (211, 221, 231, and 241) may include corresponding on-resistances R1-R4, respectively, which may be tuned to the resistance present in the current source RX to set the current through each switch to a nominal level.

Although in FIG. 2 the current source 205 is illustrated as including a resistor Rx, other types of current sources may be used. For example, the current source 205 may be a MOSFET current source (e.g., PMOS or NMOS current source). In one embodiment, the current source 205 may be a bipolar current source.

FIGS. 3A and 3B illustrate exemplary operations of switches shown in FIG. 2. FIG. 3A illustrates a conventional quad-switch operation used with DAC element 200 of FIG. 2. FIG. 3B illustrate a quad-switch operation used with DAC element 200 of FIG. 2 according to an embodiment of the present invention.

As shown in FIG. 3A, output Iout can have mismatch problems with conventional quad-switching. When only one switch is activated in each clock cycle, the output Iout value may depend on which switch is activated (e.g., output p1 or p3 for the first state and output p2 or p4 for the second state). As shown in FIG. 3A, output Iout can take two values for each code value, either p1 or p3 for one code value (e.g., code value '0') and either p2 or p4 for another code value (e.g., code value '1'). This mismatch may be due to varying switch-on resistances R1-R4 and its role in generating the current output. Thus, conventional quad-switching operation with resistor DACs may cause linearity problems.

FIG. 3B illustrates a switching operation according to an embodiment of the present invention. The switching operation may provide switching twice every clock cycle to linearize the switch-on resistor elements. For example, for a first code value (e.g., code value '0'), output Iout may be p1 for half the cycle and p3 for the other half of the cycle. For a second code value (e.g., code value '1'), output Iout may be p2 for half the cycle and p4 for the other half of the cycle. Thus, in addition to switching each cycle regardless of a code change, the switching operation may switch twice each cycle (i.e., switch twice when there is code change each cycle and switch twice when there is no code change each cycle (dummy switching)). This may remove non-linearity due to input dependent switching activity because output Iout may average out between p1 and p3 as well as in between p2 and p4. The switching operation described herein also makes the switching constant every cycle. Thus, charge injection, if any, may be code independent.

Figure 4:
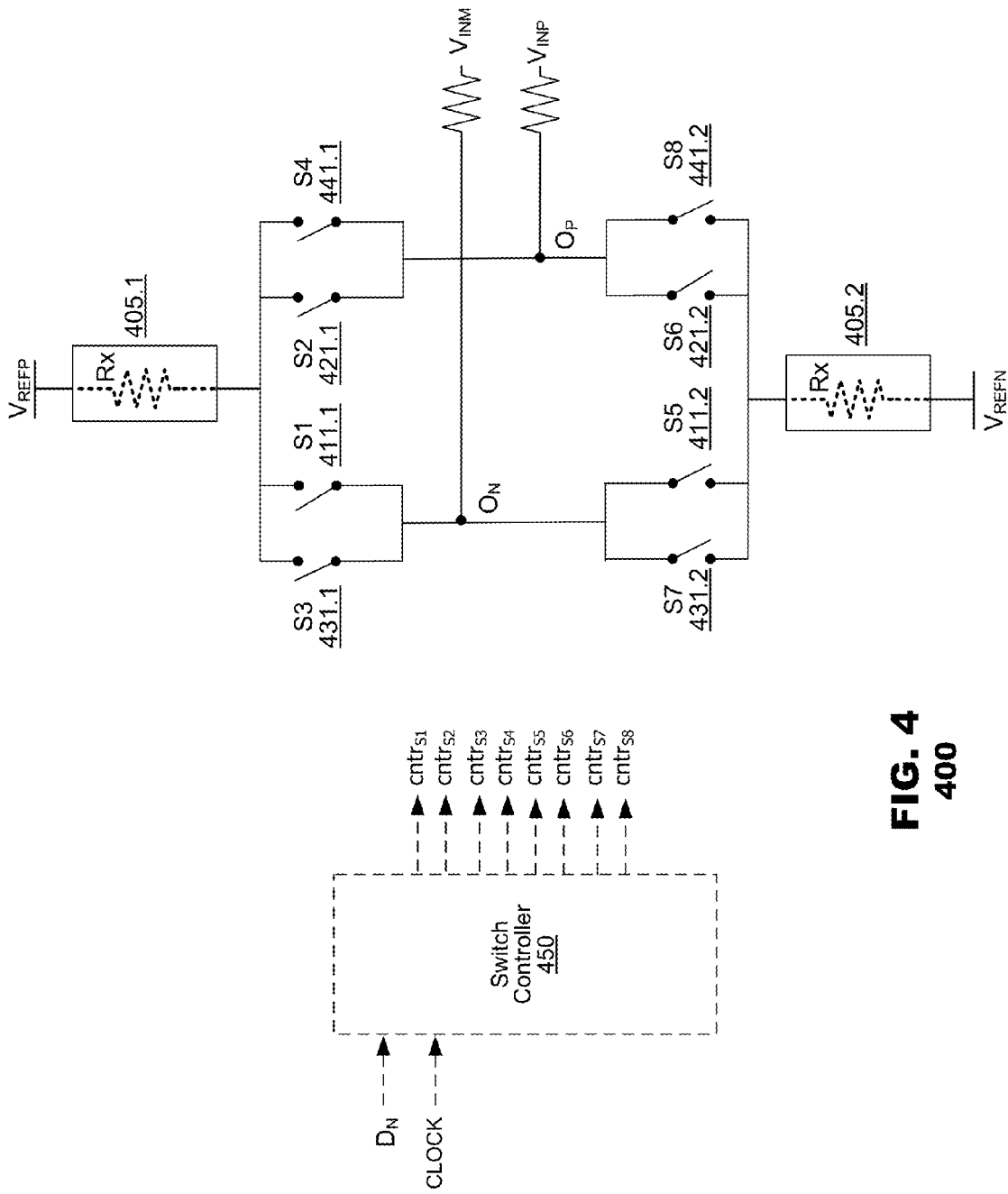
FIG. 4 illustrates a simplified circuit diagram of a differential implementation of DAC element according to an embodiment of the present invention.

FIG. 4 illustrates a simplified circuit diagram of a differential implementation of DAC element 400 according to an embodiment of the present invention. The differential DAC element 400 may include current sources 405.1 and 405.2, and a plurality of switches S1-S8 (411.1-441.2) coupling the current sources 405.1 and 405.2 to outputs $O_N$, $O_P$. The DAC element 400 also may include a switch controller 450 providing control signals $cntr_1$-$cntr_8$ to the switches S1-S8. The DAC element 400 may be provided in the DAC 140 of FIG. 1.

The plurality of switches S1-S8 (411.1-441.2) may establish two circuit branches between the current sources 405.1 and 405.2. Switches 411.1, 411.1, 431.1 and 431.2 may define a first branch, established between the first current source 205.1, the first output $O_N$ and the second current source 405.2. Switches 421.1, 421.1, 441.1 and 441.2 may define a second branch, established between the first current source 405.1, the second output $O_P$ and the second current source 405.2.

Table 1 illustrates switching that may occur during operation of the unit cell 400 to provide current or drain current from the outputs $O_N$, $O_P$. There are two major states of operation for the unit cell: 1) the cell 400 provides current to the first terminal $O_N$ and drains current from the second terminal $O_P$, and 2) the cell 400 drains current from the first terminal $O_N$ and supplies current to the second terminal $O_P$. The first state may correspond to a negative state (e.g., current provided to the output $O_N$ and current drained from the output $O_P$). The second state may correspond to a positive state (e.g., current provided to the output $O_P$ and current drained from the output $O_N$). The definitions of the states discussed above are discussed with reference to the embodiment shown in FIG. 4, but may be defined differently in other embodiments.

TABLE 1

| | ADD CURRENT TO TERMINAL $O_N$/DRAIN CURRENT FROM TERMINAL $O_P$ | | DRAIN CURRENT FROM TERMINAL $O_N$/ADD CURRENT TO TERMINAL $O_P$ | |
|---|---|---|---|---|
| | PHASE 1 | PHASE 2 | PHASE 1 | PHASE 2 |
| S1 (411.1) | Closed | Open | Open | Open |
| S3 (431.1) | Open | Closed | Open | Open |
| S5 (411.2) | Open | Open | Closed | Open |
| S7 (431.2) | Open | Open | Open | Closed |
| S2 (421.1) | Open | Open | Open | Closed |
| S4 (441.1) | Open | Open | Closed | Open |
| S6 (421.2) | Open | Closed | Open | Open |
| S8 (441.2) | Closed | Open | Open | Open |

During operation, only one switch in the first and second branch may be closed at a time. Thus, if switch 411.1 were closed to connect the output terminal $O_N$ to the first current source 205.1, the switches 411.2, 431.1 and 431.2 each may be open. Similarly, if switch 421.2 were closed to connect the second output terminal $O_P$ to the second current source 405.2, the other switches 421.1, 441.1 and 441.2 in the second branch may be opened.

Activation of the switches in the first and second branches may be operated in complementary fashion. When a switch in one branch (say, 431.1) closes to connect the first resistor 405.1 to one output terminal $O_N$, no other switches that are connected to the first resistor 405.1 may be closed. When the first switch 411.1 is closed, a switch (421.2) in the other branch will close to connect the other output terminal $O_P$ to the second resistor 405.2.

The switching table merely illustrates an example of the principles of the present invention. Other embodiments are permissible. Such implementation variations are immaterial to the operation of the unit cell 400 unless described hereinbelow.

The switch controller 250 may provide control signals $cntr_1$-$cntr_8$ to control the switches S1-S8. The switches S1-S8 may be controlled to provide one of two states of operations during each cycle, by coupling the first current source 405.1 to one of the outputs $O_N$, $O_P$ and the second current source 405.2 to the other one of the outputs $O_N$, $O_P$. The switch controller 250 may provide control signals $cntr_1$-$cntr_8$ based on the digital input signal $D_N$. In one embodiment, the digital input signal $D_N$ may represent one bit of the digital code $D_{OUT}$ provided by ADC 130 in FIG. 1. As discussed above in the first state, the cell 400 may provide current to the first terminal $O_N$ and drain current from the second terminal $O_P$, and in the second state the cell 400 may drain current from the first terminal $O_N$ and supply current to the second terminal $O_P$. One of the states may be provided during each clock cycle.

Traditionally, to account for distortion in the output signal when there is no code change, different switches are used to provide the same state in consecutive cycle. However, when different switches are activated during consecutive clock cycles to provide the same state, a different value may be provided at the output in each cycle.

The embodiment of FIG. 4 may mitigate against non-linearity due to input dependent switching activity by using different switches consecutively to provide one of the states during one cycle. For example, to provide the first state during one cycle, the switches 411.1 and 421.2 may be activated for a portion of the cycle and switches 431.1 and 441.2 may be activated for the remaining portion of the same cycle. Switches 411.1 and 421.2 may be deactivated when switches 431.1 and 441.2 are activated. Similarly, to provide the second state during one cycle, the switches 411.2 and 421.1 may be activated for a portion of the cycle and switch 431.2 and 441.1 may be activated for the remaining portion of the same cycle. Switches 411.2 and 421.1 may be deactivated when switches 431.2 and 441.1 are activated. The switches providing each state, may be activated for approximately half of the cycle.

Activating different switches during one cycle to provide the same state may reduce the non-linear nature of the DAC element 400 due to input dependent switching activity. The non-linear nature of the DAC element 400 may be reduced because the output current does not depend on just one switch resistance which is use during the whole cycle, but now depends on the average of multiple switch resistances. In addition, because the number of switches switching may be constant every cycle, any charge injection due to the switches may be input code independent.

In other embodiments (now shown in FIG. 4), additional switches may be provided in parallel to the switches S1-S8. With these embodiments, each of the switches provided in parallel may be activated for a portion of the clock cycle to provide the same state during one cycle. Each switch from the group may be activated for approximately the same portion of the cycle.

In one embodiment, a third state (i.e., an inert state) may be provided during which the current is not provided to or drained from the outputs $O_N$, $O_P$. This state may be provided by tri-level unit elements. In this embodiment, one or more additional switches may be provided between the current sources 405.1, 405.2 and a dump node. The third state may be provided when the additional switches are activated to couple the current sources 405.1, 405.2 to the dump node.

The switches S1-S8 may be implemented as MOS transistors (e.g., NMOS, PMOS or low voltage NMOS). The switches S1-38 may include corresponding on-resistances R1-R8, respectively, which may be tuned to the resistance present in the current source RX to set the current through each switch to a nominal level.

Although in FIG. 4 the current sources 405.1, 405.2 are illustrated as including a resistor Rx, other types of current sources may be used. For example, the current sources 405.1, 405.2 may be MOSFET current sources (e.g., PMOS or NMOS current source). In one embodiment, the current sources 405.1, 405.2 may be bipolar current sources.

Figure 5:
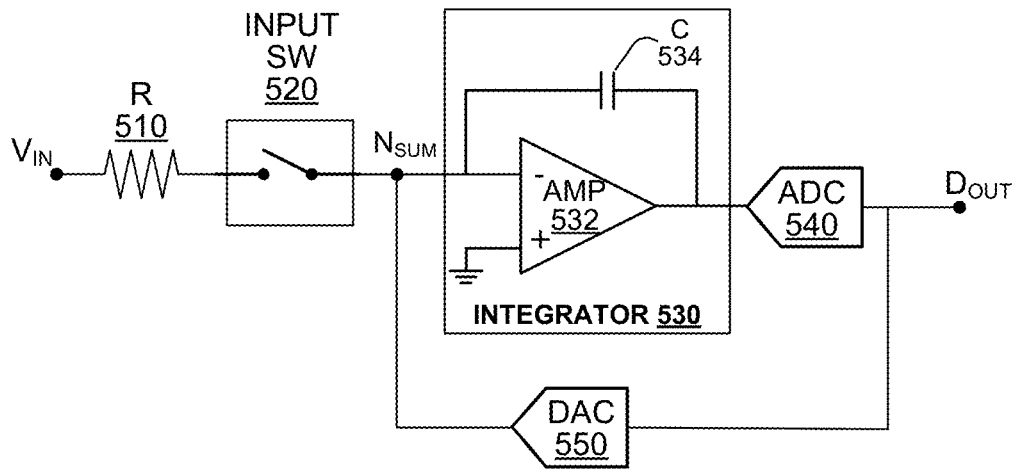
FIG. 5 illustrates a simplified block diagram of a CTDSM according to an embodiment of the present invention.

FIG. 5 illustrates a simplified block diagram of a CTDSM 500 according to an embodiment of the present invention. The CTDSM 500 may include an input resistor 510, an input switch structure 520, an integrator 530, an ADC 540, and a digital-to-analog converter (DAC) 550. The CTDSM 500 may receive an analog input signal $V_{IN}$ at an input and provide a digital output signal $D_{OUT}$ at an output corresponding to the analog input signal $V_{IN}$.

An input signal $V_{IN}$ may be provided to a first terminal of the input resistor 510, and a second terminal of the input resistor 510 may be coupled to an input terminal of the integrator 530 via the input switch structure 520. An output of the integrator 530 may be coupled to an input of the ADC 540. The ADC 540 may provide the digital output signal $D_{OUT}$. The DAC 550 may generate a current $I_F$ which may be input to node $N_{SUM}$ along with a current $I_{IN}$ supplied by the resistor 510.

The input signal $V_{IN}$ may be applied to the input resistor 510 to provide an input current $I_{IN}$ corresponding to the input voltage signal $V_{IN}$. The integrator 530 may receive the input current $I_{IN}$ and an analog-converted feedback signal $I_F$ from the DAC 550, and integrate a sum of the input current $I_{IN}$ and the feedback signal $I_F$. The integrator 530 may include an operational amplifier 532 and an integrating capacitor 534. The input signal $V_{IN}$ may be a single-ended signal or a differential signal.

The ADC 540 may convert the output of the integrator 530 into a digital code $D_{OUT}$. The DAC 550 may convert the digital output signal $D_{OUT}$ into an analog feedback signal $I_F$. The analog feedback signal $I_F$ may be summed with the input current $I_{IN}$ at the summing node $N_{SUM}$, and the summed signal may be provided to the integrator 530.

The DAC 550 may be implemented as a resistor DAC, a current steering DAC or another DAC architecture. The resistor DAC may include resistor elements and switch elements. The resistor DAC may include resistor elements and switch elements. In an embodiment, the resistor elements may be thin-film resistors (TFRs). The DAC 550 may include current elements as discussed above with reference to FIGS. 1-4.

The DAC 550 may include control circuit, a number of current elements and an adder. The control circuit may provide control signals to the current elements, based on the digital code input into the DAC 550. The control signals may turn on and off a plurality of switches within each unit cell to control the contribution of each current element to the output signal $I_F$ representing the digital code $D_{OUT}$. The outputs of each of the current elements may be summed via the adder to provide output signal $I_F$. The DAC 550 may receive a new digital code $D_{OUT}$ and generate an output signal $I_F$ every cycle of the clock. As discussed in more detail above, the control circuit may provide control signals such that during one clock cycle different switches are activated in the unit elements to provide the same state of the unit elements.

The plurality of current elements in the DAC 550 may be identical unit elements (e.g., two-level current steering elements or three-level current steering elements). The two-level current steering elements may provide an output that varies between two states: a positive state and an inert state or, alternatively, a positive state and a negative state. The three-level current steering unit elements may provide three output states: a positive state, a negative state and an inert state. In such an embodiment, the positive states and negative states of each of the unit elements would generate currents having identical magnitudes (absent manufacturing variations). In this example, the DAC 550 may include $2^N$ unit elements for an N-bit code $D_{OUT}$.

Alternatively, the current elements may be weighted cells, where each of the weighted cells may provide a different current value. In such an embodiment, the positive states and negative states of the binary-weighted unit elements would generate currents having magnitudes that are related by $2^i$ (again, absent manufacturing variations), where i=0, 1, 2, . . . N. In this example, the DAC 550 may include N current elements for an N-bit code $D_{OUT}$.

The input switch structure 520 may include a plurality of switches. The switches may be controlled to match the DC input of the DAC currents generated by the DAC 550. Thus, there is switching activity not just in the DAC 550 but also in the input resistance. Without this switching at the input switch structure 520, the DAC switching may cause mismatch between the input and feedback path of the CTDSM 500.

The switches in the input switch structure 520 may be operated in synchronization with the switches in the DAC 550. For example, for a portion of the clock cycle a first switch or set of switches may be activated to couple the resistor 510 to the integrator 530 and for another portion of the clock cycle a different switch or set of switches may be activated to couple the resistor 510 to the integrator 530. The switches in the input switch structure 520 may match the switches in the unit elements of DAC 550.

Figure 6:
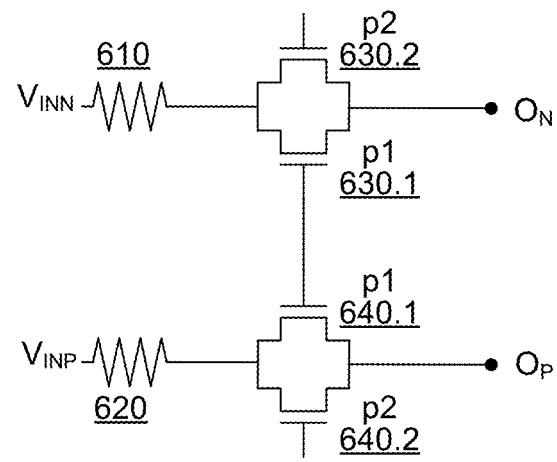
FIG. 6 illustrates a circuit diagram of an input stage with an input switch structure according to an embodiment of the present invention.

FIG. 6 illustrates a circuit diagram of an input stage 600 with an input switch structure according to an embodiment of the present invention. The input stage 600 may correspond to the input switch 520 shown in FIG. 5.

The input stage 600 may include input resistors 610, 620 and a plurality of switches 630.1-640.2 coupled between the input resistors 610, 620 and the outputs $O_N$ and $O_P$. A first terminal of the first resistor 610 may be coupled to the first input $V_{INN}$ and a second terminal of the resistor 610 may be coupled to a first set of switches 630.1, 630.2. A first terminal of the second resistor 620 may be coupled to the second input $V_{INP}$ and a second terminal of the resistor 620 may be coupled to a second set of switches 640.1, 640.2. The first set of switches may include switches 630.1, 630.2 in parallel and the second set of switches may include switches 640.1, 640.2 coupled in parallel. The outputs $O_N$ and $O_P$ of the switches may be coupled to the integrator inputs (virtual ground nodes $O_P$, $O_M$) and DAC feedback.

The input(s) may receive an analog input voltage signal $V_{IN}$, which may vary continually over time. The inputs may be provided for differential signals $V_{INP}$ and $V_{INM}$. The first set of switches 630.1, 630.2 may provide the input signal to the output $O_N$. Similarly, the second set of switches 640.1, 640.2 may provide the input signal to the output $O_P$. In each clock cycle the switches 630.1, 630.2 may be activated consecutively and switches 640.1, 640.2 may be activated consecutively. The switches 640.1-640.2, 650.1-650.2 may be operated in synchronization with the DAC switches as described above in the discussion of FIGS. 2-4.

In another embodiment, additional switches may be coupled in parallel to switches 630.1, 630.2 and additional switches may be coupled in parallel to switches 640.1, 640.2. The number of switches in each set may correspond to the number of switches in each branch of the unit element (e.g., unit element shown in FIG. 2). In another embodiment, only two switches may be provided instead of four with each path having one switch.

Discrete switching with distinct non-overlapping periods ("dead time") may adversely affect anti-aliasing. During dead times, high frequency content, for example, can fold down, thus moving in band. To preserve the anti-aliasing properties, current steering may be employed in the input switching operation. Current steering may steer the current from the input path to another such that the overall current going into the virtual ground nodes (OP, ON) has minimal changes during switch transitions.

Figure 7:
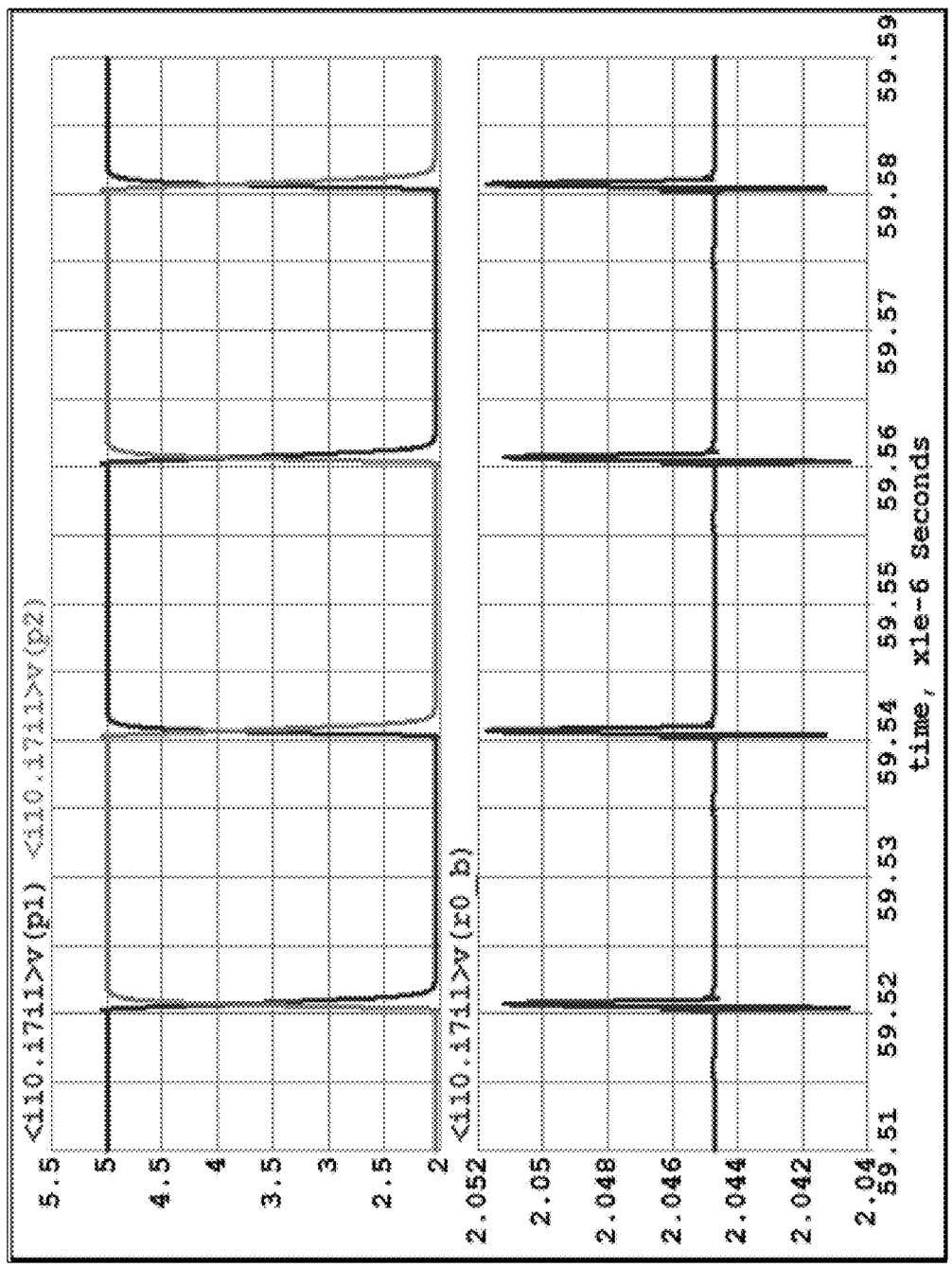
FIG. 7 illustrates the current steering switch operation according to an embodiment of the present invention.

FIG. 7 illustrates the current steering switch operation according to an embodiment of the present invention. As shown, current for the "on" switch is gradually reduced while the current for the "off" switch is gradually increased to reduce the dead times.

The top plot in FIG. 7 shows the gate control signals of the switches, which may perform the input-side current steering. The bottom plot in FIG. 7 shows the voltage across the input resistor for a full scale input. As can be seen, the change in voltage across the resistor may be minimized as the current is steered from one path to another. This may reduce the fold down of high frequency content.

Input switching described herein may have other applications. For example, input switching operations as described herein may be employed with a dual return to zero (DRTZ) scheme. In a DRTZ scheme, two DACs may be used in a CTDSM conversion. One DAC may be used for one half of the cycle, and the other DAC may be used for the other half. Input switching as described herein may be used in synchronization with the DRTZ DACs to reduce mismatch errors.

Figure 8:
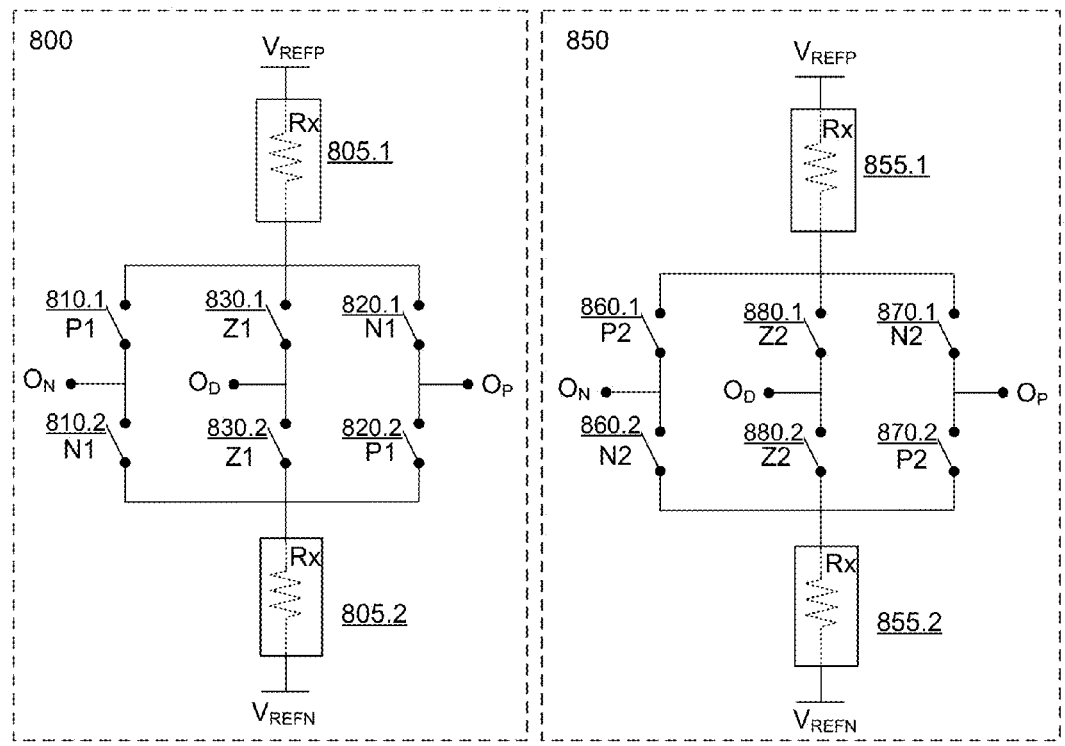
FIG. 8 illustrates a simplified circuit and timing diagrams of a dual return to zero (DRTZ) switching scheme according to an embodiment of the present invention.
Figure 8:
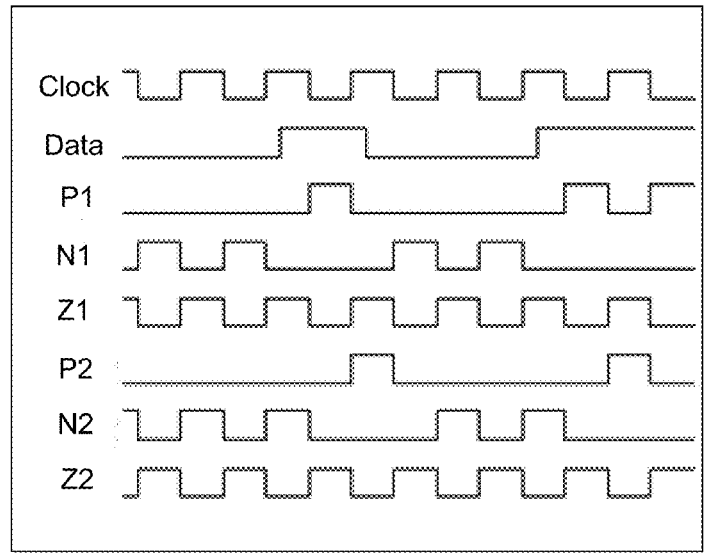

FIG. 8 illustrates a simplified circuit and timing diagram of a dual return to zero switching (DRTZ) scheme according to an embodiment of the present invention. The circuit may include two tri-level current elements 800 and 850. The first tri-level current element 800 may include current sources 805.1 and 805.2, and a plurality of switches (810.1-830.2) coupling the current sources 805.1 and 805.2 to the outputs $O_N$, $O_P$ and dump node $O_D$. Similarly, the second tri-level current element 850 may include current sources 855.1 and 855.2, and a plurality of switches (860.1-880.2) coupling the current sources 855.1 and 855.2 to the outputs $O_N$, $O_P$ and dump node $O_D$. The tri-level current elements 800 and 850 may be included in the DAC 140 of FIG. 1.

In the first current element 800, the plurality of switches (810.1-830.2) may establish three circuit branches between the current sources 805.1 and 805.2. Switches 810.1 and 810.2 may define a first branch, established between the first current source 805.1, the first output $O_N$ and the second current source 805.2. Switches 820.1 and 820.2 may define a second branch, established between the first current source 805.1, the second output $O_P$ and the second current source 805.2. Switches 830.1 and 830.2 may define a third branch, established between the first current source 805.1, the dump node $O_D$ and the second current source 805.2.

In the second current element 850, the plurality of switches (860.1-880.2) may establish three circuit branches between the current sources 855.1 and 855.2. Switches 860.1 and 860.2 may define a first branch, established between the first current source 855.1, the first output $O_N$ and the second current source 855.2. Switches 870.1 and 870.2 may define a second branch, established between the first current source 855.1, the second output $O_P$ and the second current source 855.2. Switches 880.1 and 880.2 may define a third branch, established between the first current source 855.1, the dump node $O_D$ and the second current source 855.2.

There are three major states of operation for the current elements: 1) the current elements 800 or 850 provides current to the first terminal $O_N$ and drains current from the second terminal $O_P$; 2) the current elements 800 or 850 drains current from the first terminal $O_N$ and supplies current to the second terminal $O_P$; and 3) the current elements 800 or 850 does not drain current nor supply current to the terminals $O_N$ and $O_P$ (e.g., current elements 800 or 850 couples the current sources to the dump node $O_D$). The first state may correspond to a negative state (e.g., current provided to the output $O_N$ and current drained from the output $O_P$). The second state may correspond to a positive state (e.g., current provided to the output $O_P$ and current drained from the output $O_N$). The definitions of the states discussed above are discussed with reference to the embodiment shown in FIG. 8, but may be defined differently in other embodiments.

During operation, one of the current elements 800 or 850 may couple the current sources to the outputs $O_N$ and $O_P$, while the other current element couples the current sources to the dump node $O_D$. After providing a signal at the outputs $O_N$ and $O_P$, the current element may "return to zero," while the other current element provides the next signal at the outputs $O_N$ and $O_P$.

The switch controller (not shown in FIG. 8) may provide control signals (P1, P2, N1, N2, Z1 and Z2) to control the switches in the current elements 800 and 850. The switches in each of the current elements 800 and 850 may be controlled to provide one of three states of operations during each cycle. While the switches in one current element 800 or 850 are controlled to couple the current sources to the outputs $O_N$ and $O_P$, the switches in the other current element may be controlled to couple the current sources to the dump node $O_D$. The switch controller may provide control signals based on the digital input signal Data. In one embodiment, the digital input signal may represent one bit of the digital code $D_{OUT}$ provided by ADC 130 in FIG. 1. As discussed above in the first state, the current elements 800 or 850 may provide current to the first terminal $O_N$ and drain current from the second terminal $O_P$, and in the second state the current elements 800 or 850 may drain current from the first terminal $O_N$ and supply current to the second terminal $O_P$. One of the states may be provided during each clock cycle.

Traditionally, each of the current elements 800 and 850 will be controlled to provide one of the states, the state will be keep the same during the whole cycle, and the state provided by each current element will switch every cycle. To mitigate against non-linearity due to input dependent switching activity by using different switches, each of the current elements 800 and 850 may provide one of the states (e.g., providing current at the outputs $O_N$ and $O_P$) for a portion of the cycle. While one current element is providing current (e.g., positive or negative) at the outputs $O_N$ and $O_P$, the other current element may be couple the current sources to the dump node $O_D$.

For example, as shown by the timing diagram, to provide the first state during one cycle, the switches 810.1 and 820.2 in the first current element 800 may be activated (e.g., via control signal P1) for a portion of the cycle and switches 860.1 and 870.2 in the second current element 850 may be activated (e.g., via control signal P2) for the remaining portion of the same cycle. While switches 810.1 and 820.2 are activated, switches 880.1 and 880.2 in the second current element 850 may be activated (e.g., via control signal Z2) to couple the current sources 855.1 and 855.2 to the dump node $O_D$. Similarly, while switches 860.1 and 870.2 are activated, switches 830.1 and 830.2 in the first current element 800 may be activated (e.g., via control signal Z1) to couple the current sources 805.1 and 805.2 to the dump node $O_D$.

To provide the second state during one cycle, the switches 820.1 and 810.2 in the first current element 800 may be activated (e.g., via control signal N1) for a portion of the cycle and switches 870.1 and 860.2 in the second current element 850 may be activated (e.g., via control signal N2) for the remaining portion of the same cycle. While switches 820.1 and 810.2 are activated, switches 880.1 and 880.2 in the second current element 850 may be activated (e.g., via control signal Z2) to couple the current sources 855.1 and 855.2 to the dump node $O_D$. Similarly, while switches 870.1 and 860.2 are activated, switches 830.1 and 830.2 in the first current element 800 may be activated (e.g., via control signal Z1) to couple the current sources 805.1 and 805.2 to the dump node $O_D$.

In many embodiments, the current sources in FIG. 8 may be provided as a resistor Rx which may be a thin film resistor and which gives low 1/f noise corners. However, the principles of the present invention may find application with active current sources if desired for other application needs. According to one embodiment (not shown in FIG. 8), one or more of the resistors Rx may be shared by both of the current elements 800 and 850.

FIGS. 1 and 5 illustrate a first-order CTDSM for illustration purposes only, and the embodiments of the present invention may be provided with other architectures of CTDSMs (e.g., higher order CTDSMs) or may be provided with a discrete time delta-signal modulators (DTDSMs). For example, additional processing stages, as known in the art, may be included between integrator 120/530 and ADC 130/540 to provide higher order processing. The CTDSM shown in FIGS. 1 and 5 may be used for both AC and DC operations.

In the above description, for purposes of explanation, numerous specific details have been set forth in order to provide a thorough understanding of the inventive concepts. As part of this description, some structures and devices may have been shown in block diagram form in order to avoid obscuring the invention. Reference in the specification to "one embodiment" or "an embodiment" means that a particular feature, structure, or characteristic described in connection with the embodiment is included in at least one embodiment of the invention, and multiple references to "one embodiment" or "an embodiment" should not be understood as necessarily all referring to the same embodiment.

One or a plurality of the above illustrated operations described herein may be implemented in a computer program that may be stored on a storage medium having instructions to program a system to perform the operations. The storage medium may include, but is not limited to, any type of disk including floppy disks, optical disks, compact disk read-only memories (CD-ROMs), compact disk rewritable (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions. Other embodiments may be implemented as software modules executed by a programmable control device.

As used in any embodiment in the present disclosure, "circuitry" may comprise, for example, singly or in any combination, analog circuitry, digital circuitry, hardwired circuitry, programmable circuitry, state machine circuitry, and/or firmware that stores instructions executed by programmable circuitry. Also, in any embodiment herein, circuitry may be embodied as, and/or form part of, one or more integrated circuits.

It will be appreciated that in the development of any actual implementation (as in any development project), numerous decisions must be made to achieve the developers' specific goals (e.g., compliance with system and business related constraints), and that these goals will vary from one implementation to another. It will also be appreciated that such development efforts might be complex and time consuming, but would nevertheless be a routine undertaking for those of ordinary skill in art having the benefit of this disclosure.

What is claimed is:

1. A current element, comprising:
    a current source;
    a plurality of switches arranged to form two circuit branches between the current source and a first and a second outputs, wherein:
        the first circuit branch includes two switches defining parallel current paths between the current source and the first output terminal,
        the second circuit branch includes two switches defining parallel current paths between the current source and the second output terminal, and
    a control circuit, responsive to an input signal that selects one of the circuit branches, providing control signals to close one of switches in the selected circuit branch in a first portion of a clock cycle and to close the other of the switches in the selected circuit branch in a second portion of the clock cycle.

2. The current element of claim 1, wherein the current source is a resistor.

3. The current element of claim 1, wherein at least one current path changes state between each cycle of a driving clock.

4. The current element of claim 1, wherein at least one current path changes state between each phase of a driving clock.

5. The current element of claim 1, wherein the switches that are activated in one cycle are activated for a common duration.

6. The current element of claim 1, wherein:
    the two switches in the first circuit branch are activated consecutively during one cycle to provide a first state in which the current source is coupled to the first output terminal, and
    the two switches in the second circuit branch are activated consecutively during one cycle to provide a second state in which the current source is coupled to the second output terminal.

7. The current element of claim 1, further comprising an additional switch forming a third branch between the current source and a dump node.

8. The current element of claim 1, wherein the switches are one of NMOS switch and PMOS switch.

9. A current element, comprising:
    a first current source;
    a second current source;
    a plurality of circuit branches connected between the first current source and the second current source, wherein:
        a first circuit branch defines two parallel current paths, each current path including one switch connected between the first current source and a first output terminal and another switch connected between the second current source and the first output terminal;
        a second circuit branch defines two parallel current paths, each current path including one switch connected between the first current source and a second output terminal and another switch connected between the second current source and the second output terminal; and
    a controller, responsive to an input signal that selects one of the first and second current sources to be connected to the first output terminal and selects the other of the first and second current sources to be connected to the second output terminal, the controller providing control signals to the switches in the circuit branch that is connected to the first output terminal to pass current through a first parallel current path in a first portion of a clock cycle and to pass current through a second parallel current path in a second portion of the clock cycle and providing control signals to the switches in the circuit branch that is connected to the second output terminal to pass current through a first parallel current path thereof in the first portion of a clock cycle and to pass current through a second parallel current path thereof in the second portion of the clock cycle.

10. The current element of claim 9, wherein the first and second current sources are resistors.

11. The current element of claim 9, wherein the switches that are activated consecutively in one clock cycle are activated for a common duration.

12. The current element of claim 9, wherein at least one current path changes state between each cycle of a driving clock.

13. The current element of claim 9, wherein at least one current path changes state between each phase of a driving clock.

14. The current element of claim 9, wherein the switches are one of NMOS switch and PMOS switch.

15. The current element of claim 9, wherein the first and second output terminals provide a differential output signal.

16. A digital-to-analog converter, comprising:
    a plurality of current elements for converting digital data into an analog signal, each current element including:
        a current source;
        a plurality of switches arranged to form two circuit branches between the current source and a first and a second outputs, wherein:
            the first circuit branch includes two switches defining parallel current paths between the current source and the first output terminal,
            the second circuit branch includes two switches defining parallel current paths between the current source and the second output terminal, and
        a control circuit, responsive to an input signal that selects one of the circuit branches, providing control signals to close one of switches in the selected circuit branch in a first portion of a clock cycle;
    an adder for adding analog signals output from each of the current elements.

17. The digital-to-analog converter of claim 16, wherein the current source is a resistor.

18. The digital-to-analog converter of claim 16, wherein at least one current path changes state between each cycle of a driving clock.

19. The digital-to-analog converter of claim 16, wherein at least one current path changes state between each phase of a driving clock.

20. The digital-to-analog converter of claim 16, wherein each current element further includes an additional switch forming a third branch between the current source and a dump node.

21. The digital-to-analog converter of claim 16, wherein the switches in the unit elements are one of NMOS switch and PMOS switch.

22. A circuit comprising, comprising:
   an integrator receiving a current signal from an input node representing a difference between an input signal and a feedback signal;
   an analog-to-digital converter (ADC) circuit coupled to an output of the integrator;
   a digital-to-analog converter (DAC) circuit coupled to the output of the ADC circuit and providing the feedback signal to the input node, comprising a plurality of current elements controlled by an output signal from the ADC and comprising:
      a current source; and
      a circuit branch(es) coupling the current source to output terminal(s) of the current element, each circuit branch comprising a plurality of parallel circuit paths extending between the current source and the respective output terminal;
      a driver circuit to control switching within the circuit branch(es) in response to the ADC output signal wherein, during first phase of a clock cycle, a first parallel circuit path conducts current to an output terminal and, during a second phase of the clock cycle, a second parallel circuit path conducts current to the output terminal.

23. The circuit of claim 22, wherein the current source is a resistor.

24. The circuit of claim 22, wherein the driver control the switching within the circuit branch(es) such that at least one current path changes state between each cycle of a driving clock.

25. The circuit of claim 22, wherein the driver control the switching within the circuit branch(es) such that at least one current path changes state between each phase of a driving clock.

26. The circuit of claim 22, further comprising an input switch structure coupling an input resistor to the integrator.

27. The circuit of claim 22, wherein the input switch structure includes a plurality of switches and the switches are controlled in synchronization with the switches in the unit elements.

* * * * *